(12) United States Patent
Doi

(10) Patent No.: US 8,736,472 B2
(45) Date of Patent: May 27, 2014

(54) VOLUME ADJUSTING CIRCUIT AND VOLUME ADJUSTING METHOD

(71) Applicant: Masayuki Doi, Osaka (JP)

(72) Inventor: Masayuki Doi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/659,103

(22) Filed: Oct. 24, 2012

(65) Prior Publication Data
US 2013/0106635 A1    May 2, 2013

(30) Foreign Application Priority Data
Oct. 31, 2011    (JP) ................. 2011-238582

(51) Int. Cl.
H03M 1/00 (2006.01)
H03M 1/66 (2006.01)
H03M 1/70 (2006.01)

(52) U.S. Cl.
CPC . H03M 1/70 (2013.01); H03M 1/66 (2013.01)
USPC .......................................... 341/139; 341/144

(58) Field of Classification Search
CPC ....................................................... H03M 1/66
USPC .......... 341/155, 143, 144, 145, 139; 381/312, 381/107
See application file for complete search history.

(56) References Cited

U.S. PATENT DOCUMENTS

| 5,046,107 | A  | * | 9/1991  | Iwamatsu ............... | 381/107 |
| 5,243,344 | A  | * | 9/1993  | Koulopoulos et al. ... | 341/143 |
| 7,433,481 | B2 | * | 10/2008 | Armstrong et al. ...... | 381/312 |
| 2003/0012391 | A1 | * | 1/2003 | Armstrong et al. ...... | 381/312 |

FOREIGN PATENT DOCUMENTS

| JP | 60-80349 | 5/1985 |
| JP | 4007151 | 11/2007 |

* cited by examiner

Primary Examiner — Jean B Jeanglaude
(74) Attorney, Agent, or Firm — Cooper & Dunham LLP

(57) ABSTRACT

A volume adjusting circuit which converts a digital audio signal to an analog signal by a D/A converter and outputs the analog signal includes: a first gain variable circuit unit which controls a gain of the digital audio signal; a second gain variable circuit unit which controls a gain of the analog signal output from the D/A converter; a storage unit which stores gain setting value; and a control unit which controls the gain of the first gain variable circuit unit and the gain of the second gain variable circuit unit based on the gain setting value stored in the storage unit, wherein the storage unit and the control unit are shared in controlling the first gain variable circuit unit and in controlling the second gain variable circuit unit.

8 Claims, 5 Drawing Sheets

--PRIOR ART--

FIG.2

| DIGITAL GAIN SETTING VALUE G1 | DIGITAL GAIN DG | ANALOG GAIN SETTING VALUE G2 | ANALOG GAIN AG |
|---|---|---|---|
| +5dB | +5dB | +5dB | +5dB |
| +4dB | +4dB | +4dB | +4dB |
| +3dB | +3dB | +3dB | +3dB |
| +2dB | +2dB | +2dB | +2dB |
| +1dB | +1dB | +1dB | +1dB |
| 0dB | 0dB | 0dB | 0dB |
| −1dB | −1dB | −1dB | −1dB |
| −2dB | −2dB | −2dB | −2dB |
| −3dB | −3dB | −3dB | −3dB |
| −4dB | −4dB | −4dB | −4dB |
| −5dB | −5dB | −5dB | −5dB |
| −6dB | −6dB | −6dB | −6dB |
| −7dB | −7dB | −7dB | −7dB |
| −8dB | −8dB | −8dB | −8dB |
| −9dB | −9dB | −9dB | −9dB |
| −10dB | −10dB | −10dB | −10dB |
| −11dB | −11dB | −11dB | −11dB |
| −12dB | −12dB | −12dB | −12dB |
| −13dB | −13dB | −13dB | −13dB |
| −14dB | −14dB | −14dB | −14dB |
| −15dB | −15dB | −15dB | −15dB |

--PRIOR ART--

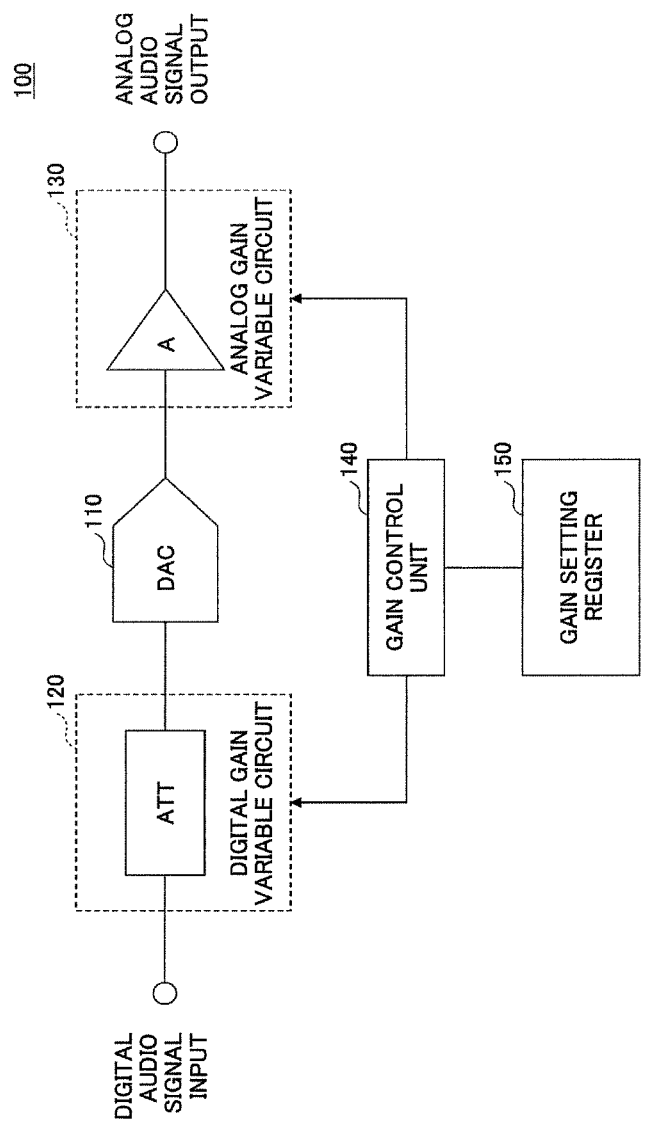

FIG.4

| GAIN SETTING VALUE G | DIGITAL GAIN DG | ANALOG GAIN AG | |
|---|---|---|---|
| +5dB | 0dB | +5dB | |
| +4dB | 0dB | +4dB | |
| +3dB | 0dB | +3dB | |
| +2dB | 0dB | +2dB | |
| +1dB | 0dB | +1dB | |
| 0dB | 0dB | 0dB | ← REFERENCE GAIN |
| −1dB | −1dB | 0dB | |
| −2dB | −2dB | 0dB | |
| −3dB | −3dB | 0dB | |
| −4dB | −4dB | 0dB | |
| −5dB | −5dB | 0dB | |
| −6dB | −6dB | 0dB | |
| −7dB | −7dB | 0dB | |
| −8dB | −8dB | 0dB | |
| −9dB | −9dB | 0dB | |
| −10dB | −10dB | 0dB | |
| −11dB | −11dB | 0dB | |
| −12dB | −12dB | 0dB | |
| −13dB | −13dB | 0dB | |
| −14dB | −14dB | 0dB | |
| −15dB | −15dB | 0dB | |

FIG.5

| GAIN SETTING VALUE G | DIGITAL GAIN DG | ANALOG GAIN AG1 |
|---|---|---|
| +5dB | 0dB | +11dB |
| +4dB | 0dB | +10dB |
| +3dB | 0dB | +9dB |
| +2dB | 0dB | +8dB |
| +1dB | 0dB | +7dB |
| 0dB | 0dB | +6dB ← REFERENCE GAIN |
| −1dB | −1dB | +6dB |
| −2dB | −2dB | +6dB |
| −3dB | −3dB | +6dB |
| −4dB | −4dB | +6dB |
| −5dB | −5dB | +6dB |
| −6dB | −6dB | +6dB |
| −7dB | −7dB | +6dB |
| −8dB | −8dB | +6dB |
| −9dB | −9dB | +6dB |
| −10dB | −10dB | +6dB |
| −11dB | −11dB | +6dB |
| −12dB | −12dB | +6dB |
| −13dB | −13dB | +6dB |
| −14dB | −14dB | +6dB |
| −15dB | −15dB | +6dB |

…

VOLUME ADJUSTING CIRCUIT AND VOLUME ADJUSTING METHOD

TECHNICAL FIELD

The present invention relates to a volume adjusting circuit and a volume adjusting method which convert a digital audio signal to an analog signal by a D/A converter and outputs the analog signal.

BACKGROUND ART

There is provided a related-art audio apparatus which is equipped with a D/A (Digital/Analog) converter and an audio amplifier. In a volume adjusting circuit included in the audio apparatus, gain adjusting of an audio signal is performed using one or both of a digital circuit and an analog circuit. A digital gain variable circuit which performs gain adjusting by the digital circuit is effective in reducing a circuit area. However, digital clipping could occur with a positive gain setting. Thus, a technique is known of adding an analog gain variable circuit to perform gain adjusting in order to obtain a sufficiently large analog output amplitude while preventing the digital clipping.

FIG. 1 is a diagram which explains the volume adjusting circuit included in the related-art audio apparatus. A related-art volume adjusting circuit 10 includes a D/A converter 1; a digital gain variable circuit 2 which is connected to a former stage of the D/A converter 1; and an analog gain variable circuit 3 which is connected to a latter stage of the D/A converter 1.

Gain adjusting is performed by two independent registers, a digital gain setting register 5 and an analog gain setting register 7, setting a digital gain and an analog gain. The digital gain variable circuit 2 is controlled by a digital gain control unit 4 in accordance with a value set in the digital gain setting register 5. The analog gain variable circuit 3 is controlled by an analog gain control unit 6 in accordance with a value set in the analog gain setting register 7.

FIG. 2 is a diagram which explains an example of related-art variable gain control. A digital gain setting value G1 is a value set to the digital gain setting register 5, while a digital gain DG is a value to be set to the digital gain variable circuit 2. An analog gain setting value G2 is a value set to the analog gain setting register 7, while an analog gain AG is a value to be set to the analog gain variable circuit 3. The digital gain DG and the analog gain AG are independently controlled by the digital gain setting register 5 and the analog gain setting register 7.

Moreover, Patent document 1 discloses, for example, having a digital variable gain unit and an analog variable gain unit, wherein only the digital variable gain unit is controlled for a setting greater than 0 dB and only the analog variable gain unit is controlled or both the analog and digital variable gain units are controlled for a setting less than 0 dB. Furthermore, Patent document 2 discloses receiving a signal such as digital data and an image from an analog transmission line to demodulate the received signal.

PATENT DOCUMENTS

Patent document 1: JP4007151B
Patent document 2: JP60-080349A

However, with such a related art configuration which includes the digital gain variable circuit and the analog gain variable circuit, the digital gain and the analog gain are respectively controlled by independent settings. Therefore, there exists a settable gain range for both the digital gain and the analog gain, so that some combinations of the digital gain and the analog gain may result in including a wasteful gain setting, which is not actually used. In addition, a possibility of occurrence of the digital clipping increases since which of the digital gain and the analog gain a gain is assigned to is left to a user.

DISCLOSURE OF THE INVENTION

In light of the circumstances as described above, an object of the present invention is to provide a volume adjusting circuit which makes it possible to eliminate a wasteful gain setting while reducing a circuit area and to decrease a possibility of occurrence of digital clipping.

According to an embodiment of the present invention, a volume adjusting circuit which converts a digital audio signal to an analog signal by a D/A converter and outputs the analog signal is provided, including a first gain variable circuit unit which controls a gain of the digital audio signal; second gain variable circuit unit which controls a gain of the analog signal output from the D/A converter; a storage unit which stores a gain setting value; and a control unit which controls the gain of the first gain variable circuit unit and the gain of the second gain variable circuit unit based on the gain setting value stored in the storage unit, wherein the storage unit and the control unit are shared in controlling the first gain variable circuit unit and in controlling the second gain variable circuit unit.

The present invention makes it possible to eliminate a wasteful gain setting while reducing a circuit area and to decrease a possibility of occurrence of digital clipping.

BRIEF DESCRIPTION OF THE DRAWINGS

Other objects, features, and advantages of the present invention will become more apparent from the following detailed descriptions when read in conjunction with the accompanying drawings, in which:

FIG. 2 is a diagram which explains an example of related-art variable gain control;

FIG. 3 is a diagram which explains a volume adjusting circuit according to a First embodiment;

FIG. 4 is a diagram which explains an example of gain setting control according to the First embodiment; and FIG. 5 is a diagram which explains an example of the gain setting control according to a Second embodiment.

BEST MODE FOR CARRYING OUT THE INVENTION

Figure 1:
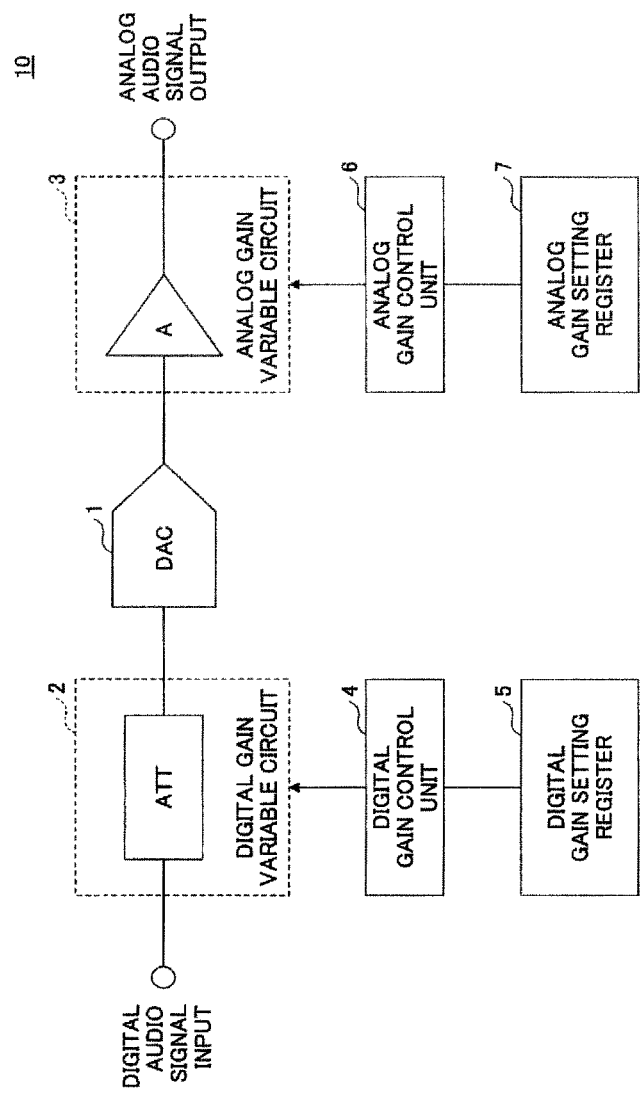
FIG. 1 is a diagram which explains a volume adjusting circuit included in a related-art audio apparatus.

In the present invention, a digital gain and an analog gain are controlled automatically with a single register in which a gain setting value is stored and a single control unit which performs digital and analog gain setting control.

First Embodiment

A description is given below with regard to a First embodiment of the present invention with reference to drawings. FIG. 3 is a diagram which explains a volume adjusting circuit according to the First embodiment.

A volume adjusting circuit 100 according to the present embodiment includes a D/A (digital/analog) converter 110; a digital gain variable circuit 120; an analog gain variable circuit 130; a gain control unit 140; and a gain setting register 150.

The digital gain variable circuit 120 is connected to a former stage of the D/A converter 110, while the analog gain variable circuit 130 is connected to a latter stage of the D/A converter 110.

A digital audio signal which is input to the volume adjusting circuit 100 according to the present embodiment is output to the D/A converter 110 after a digital gain is changed by the digital gain variable circuit 120. The D/A converter 110 converts, to an analog audio signal, and outputs, to the analog gain variable circuit 130, the digital audio signal. The analog audio signal whose analog gain was changed by the analog gain variable circuit 130 becomes an output signal of the volume adjusting circuit 100.

Gains in the digital gain variable circuit 120 and the analog gain variable circuit 130 are controlled by the gain control unit 140. The gain control unit 140 of the present embodiment controls the gains of the digital gain variable circuit 120 and the analog gain variable circuit 130 according to values set in the gain setting register 150. In the present embodiment, the register in which the gain is set is only the gain setting register 150.

The digital gain variable circuit 120 is an attenuator which is configured with a digital circuit, and a variable range of the gain is less than equal to 0 dB. The analog gain variable circuit 130 is a signal amplifying circuit which is configured with an operational amplifier circuit, and the variable range of the gain is greater than or equal to a reference gain. In the present embodiment, the reference gain is an analog gain AG at which an output may be made without causing digital clipping when the digital audio signal is at a maximum input and a digital gain DG is 0 dB. The reference gain may be a value which is set in the analog gain variable circuit 130 in advance.

Below an example of gain setting control in the volume adjusting circuit 100 of the present embodiment is shown. FIG. 4 is a diagram which explains an example of gain setting control according to the First embodiment.

A gain setting value G shown in FIG. 4 is a value set in the gain setting register 150, the digital gain DG is a value set in the digital gain variable circuit 120, and an analog gain AG is a value set in the analog gain variable circuit 130.

When the gain setting value G of the gain setting register 150 is 0 dB, the gain control unit 140 according to the present embodiment sets values of both the digital gain DG and the analog gain AG to 0 dB. Moreover, when the gain setting value G of the gain setting register 150 is less than 0 dB, the gain control unit 140 according to the present embodiment sets the analog gain AG to 0 dB and sets the digital gain DG to a value in accordance with the gain setting value G.

Furthermore, when the gain setting value G is greater than 0 dB, the gain control unit 140 according to the present embodiment sets the digital gain DG to 0 dB and sets the analog gain AG to a value in accordance with the gain setting value G.

In this way, according to the present embodiment, the digital gain variable circuit 120 is used, and gain setting control of the digital gain variable circuit 120 and the analog gain variable circuit 130 is performed by a common feature of the gain control unit 140 and the gain setting register 150. In the present embodiment, such a configuration makes it possible to decrease a circuit area of the whole volume adjusting circuit 100.

Moreover, according to the present embodiment, a variable range of the gain in the digital gain variable circuit 120 is set to not more than 0 dB, making it possible to decrease a possibility of occurrence of digital clipping.

Furthermore, when the gain setting value G is greater than or equal to 0 dB, the analog gain AG is controlled such it is changed while the digital gain DG is set to 0 dB. Moreover, when the gain setting value G is less than 0 dB, the digital gain DG is controlled such that it is changed, while the analog gain AG to be set to the analog gain variable circuit 130 is set to a reference gain. Using such control, the present embodiment may prevent wasteful gain settings not actually used from being included.

Second Embodiment

A description is given below with regard to a Second embodiment of the present invention with reference to drawings. The Second embodiment of the present invention is an embodiment in which a reference gain is set to be greater than 0 dB. In the explanation of the Second embodiment of the present invention below, the same letters used in the explanation of the First embodiment are applied to those having the same functional configuration as the First embodiment, so that repeated explanations are omitted.

FIG. 5 is a diagram which explains an example of gain setting control according to the Second embodiment. An example in FIG. 5 shows a case in which a reference gain set to the analog gain variable circuit 130 is set to +6 dB.

When the gain setting value G is 0 dB, the gain control unit 140 of the present embodiment sets the digital gain DG to 0 dB and an analog gain AG1 to +6 dB, which is the reference gain.

Moreover, when the gain setting value G is less than 0 dB, the gain control unit 140 according to the present embodiment sets the analog gain AG1 to +6 dB, which is the reference gain, and sets the digital gain DG to a value in accordance with the gain setting value G.

Furthermore, when the gain setting value G is greater than 0 dB, the gain control unit 140 according to the present embodiment sets the digital gain DG to 0 dB and sets the analog gain AG1 to a value in accordance with the gain setting value G.

In FIGS. 4 and 5, a gain setting range of the gain setting value G is set to −15 dB to +5 dB and a step for changing the gain setting value G is set to 1 dB. However, the setting range of the gain setting value G and the step for changing the gain setting value G may be set freely according to an object of embodying.

While explanations of the present invention may be provided based on respective embodiments, the present invention is not so limited to requirements shown for the above described embodiments. These matters may be changed without compromising the spirit of the present invention, so that they may be appropriately determined according to the applicable embodiments thereof.

The present application is based on Japanese Priority Application No. 2011-238582 filed on Oct. 31, 2011, the entire contents of which are hereby incorporated by reference.

The invention claimed is:

1. A volume adjusting circuit which converts a digital audio signal to an analog signal by a D/A converter and outputs the analog signal, comprising:
   a first gain variable circuit unit which controls a gain of the digital audio signal;
   a second gain variable circuit unit which controls a gain of the analog signal output from the D/A converter;
   a storage unit which stores a gain setting value; and a control unit which controls the gain of the first gain variable circuit unit and the gain of the second gain variable circuit unit based on the gain setting value stored in the storage unit, wherein the storage unit and the control unit are shared in controlling the first gain variable circuit unit and in controlling the second gain variable circuit unit.

2. The volume adjusting circuit as claimed in claim 1, wherein, when the gain setting value set in the storage unit is a first value, the control unit sets the gain of the first gain variable circuit unit to a predetermined second value and the gain of the second gain variable circuit unit to a predetermined third value; and when the gain setting value set in the storage unit is smaller than the first value, the control, unit sets the gain of the first gain variable circuit unit to a value corresponding to the gain setting value and a gain of the second gain variable circuit unit to the third value; and when the gain setting value set in the storage unit is larger than the first value, the control unit sets the gain of the first gain variable circuit unit to the second value and a gain of the second gain variable circuit unit to a value corresponding to the gain setting value.

3. The volume adjusting circuit as claimed in claim 2, wherein the third value is a reference gain set in the second gain variable circuit unit.

4. The volume adjusting circuit as claimed in claim 1, wherein the gain of the first gain variable circuit unit is controlled such that it becomes less than or equal to 0 dB.

5. A volume adjusting method which converts a digital audio signal to an analog signal by a D/A converter and outputs the analog signal, comprising:

a first gain variable step which controls a gain of the digital audio signal;

a second gain variable step which controls a gain of the analog signal output from the WA converter;

a storage step which stores a gain setting value; and a control step which controls the gain of the first gain variable step and the gain of the second gain variable step based on the gain setting value stored in the storage step, wherein the storage step and the control step are shared in controlling the first gain variable step and in controlling the second gain variable step.

6. The volume adjusting circuit as claimed in claim 5, wherein, when the gain setting value set in the storage step is a first value, the control step sets the gain of the first gain variable step to a predetermined second value and the gain of the second gain variable step to a predetermined third value; and when the gain setting value set in the storage step is smaller than the first value, the control step sets the gain of the first gain variable step to a value corresponding to the gain setting value and a gain of the second gain variable step to the third value; and when the gain setting value set in the storage step is larger than the first value, the control step sets the gain of the first gain variable step to the second value and a gain of the second gain variable step to a value corresponding to the gain setting value.

7. The volume adjusting method as claimed in claim 6, wherein the third value is a reference gain set in the second gain variable step.

8. The volume adjusting method as claimed in claim 5, wherein the gain of the first gain variable step is controlled such that it becomes less than or equal to 0 dB.

* * * * *